(12) United States Patent
Takeda et al.

(10) Patent No.: US 6,529,397 B2
(45) Date of Patent: Mar. 4, 2003

(54) MEMORY-LOGIC SEMICONDUCTOR DEVICE

(75) Inventors: Shigetoshi Takeda, Kawasaki (JP); Taiji Ema, Kawasaki (JP); Peter Bruce Gillingham, Kanata (CA)

(73) Assignees: Fujitsu Limited, Kawasaki (JP); Mosaid Technologies Inc., Kanata (CA)

( * ) Notice: Subject to any disclaimer, the term of this patent is extended or adjusted under 35 U.S.C. 154(b) by 0 days.

(21) Appl. No.: 09/750,068

(22) Filed: Dec. 29, 2000

(65) Prior Publication Data

US 2001/0046151 A1 Nov. 29, 2001

(30) Foreign Application Priority Data

May 26, 2000 (JP) ........................................ 2000-155585

(51) Int. Cl.[7] ................................................. G11C 7/00
(52) U.S. Cl. ............... 365/63; 365/185.05; 365/185.11; 365/49; 365/72; 365/185.01
(58) Field of Search .................... 365/63, 49, 72, 365/185.01, 185.05, 185.11

(56) References Cited

U.S. PATENT DOCUMENTS

| | | | |
|---|---|---|---|
| 4,247,919 A | | 1/1981 | White, Jr. et al. |
| 4,791,606 A | | 12/1988 | Threewitt et al. |
| 5,146,300 A | | 9/1992 | Hamamoto et al. |
| 5,153,685 A | | 10/1992 | Murata et al. |
| 5,196,910 A | | 3/1993 | Moriuchi et al. |
| 5,374,579 A | | 12/1994 | Kuroda |
| 5,432,356 A | * | 7/1995 | Imamura ..................... 257/24 |
| 5,466,621 A | * | 11/1995 | Hisamoto et al. ............ 437/52 |
| 5,933,363 A | | 8/1999 | Shindo ........................ 364/49 |
| 5,949,696 A | | 9/1999 | Threewitt .................... 365/49 |
| 6,038,170 A | * | 3/2000 | Shiba .................... 365/185.13 |
| 6,072,711 A | * | 6/2000 | Kang ........................... 365/65 |
| 6,291,847 B1 | * | 9/2001 | Ohyu et al. ................. 257/306 |
| 6,320,777 B1 | | 11/2001 | Lines et al. .................. 365/49 |

FOREIGN PATENT DOCUMENTS

| | | |
|---|---|---|
| JP | 3-166761 | 7/1991 |
| WO | WO/00/60604 | 10/2000 |

OTHER PUBLICATIONS

Specification of co–pending U.S. Application No. 09/749,463, filed on Dec. 28, 2000, by Shigetoshi Takeda, et al.
Lines, et al., "66 MHz 2.3M Ternary Dynamic Content Addressable Memory", IEEE Int. Workshop on Memory Technology, Design and Testing, Aug. 7–8, 2000; pp. 101–105.
European Search Report dated Sep. 6, 2001.

* cited by examiner

*Primary Examiner*—Viet Q. Nguyen
(74) *Attorney, Agent, or Firm*—Armstrong, Westerman & Hattori, LLP

(57) ABSTRACT

The semiconductor device has a plurality of basic units, each including a memory element and a logic element and having the same or bilateral symmetry structure. Each basic unit has a DRAM cell formed in a first active region, serially connected transistors of a logic element having second and third gate electrodes, first and second signal lines connected to the source/drain regions of the transistor pair, a third signal line connected to the second gate electrode, and a conductive connection terminal formed under the storage electrode of a DRAM capacitor and the third gate electrode. A semiconductor device having a plurality of basic units each including a memory cell and a logic cell formed on the same semiconductor substrate, the device being easy to manufacture and capable of high integration is provided.

13 Claims, 15 Drawing Sheets

FIG.1A
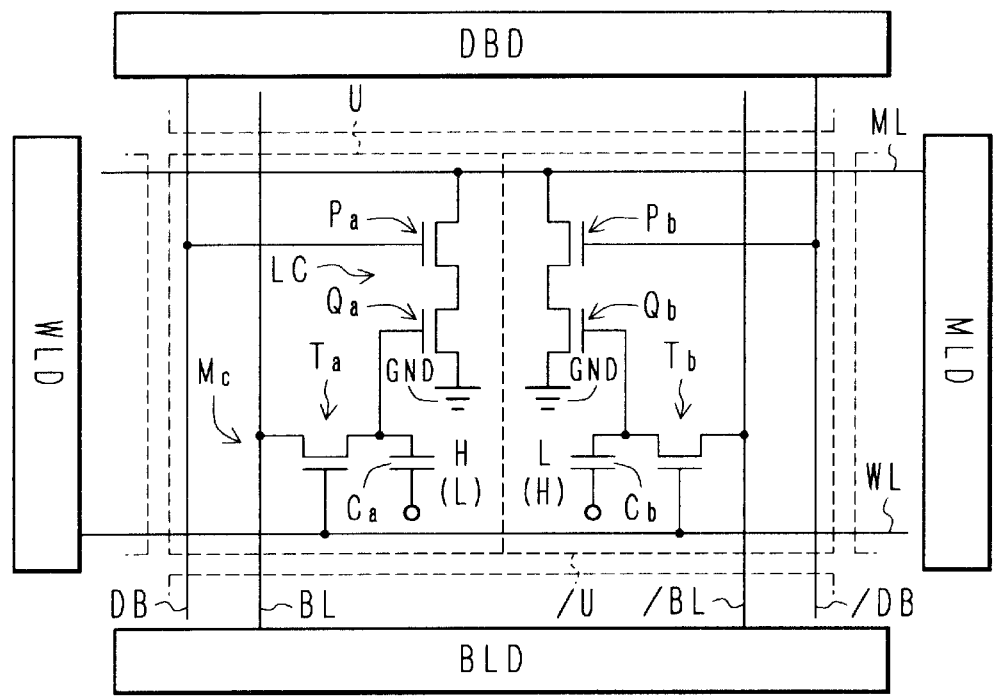
FIG.1B
| | LEFT=H、RIGHT=L OR LEFT=L、RIGHT=H | | | | LEFT=RIGHT=L |
|---|---|---|---|---|---|
| DRAM | H | L | H | L | BOTH L |
| DB | H | H | L | L | don't care |
| /DB | L | L | H | H | |
| ML | L | H | H | L | H |
FIG.1C
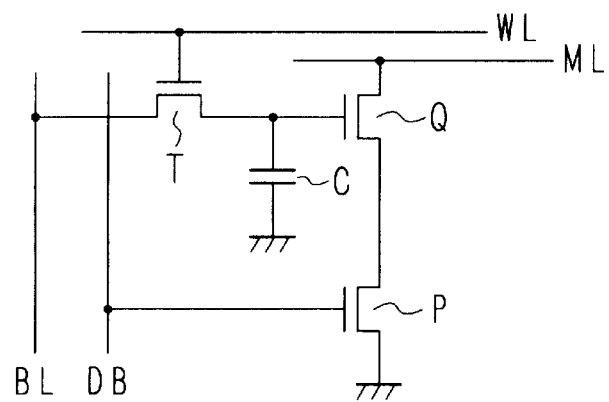

FIG.2A
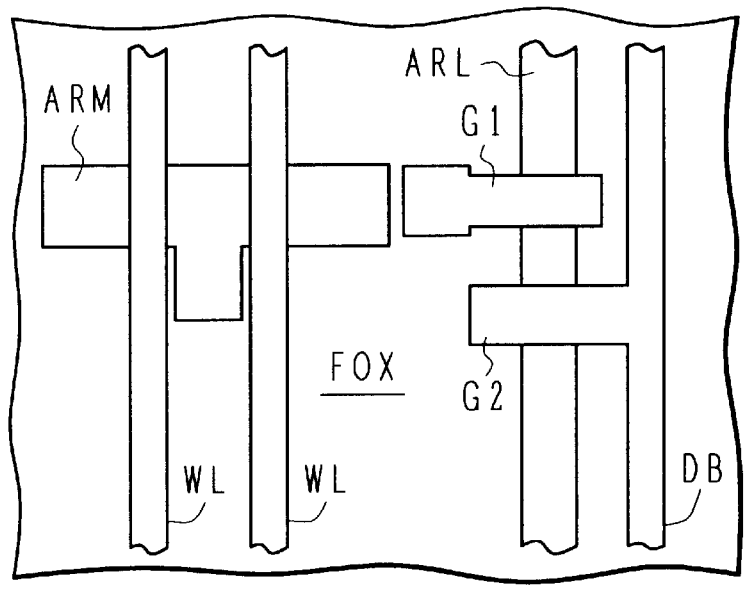
FIG.2B
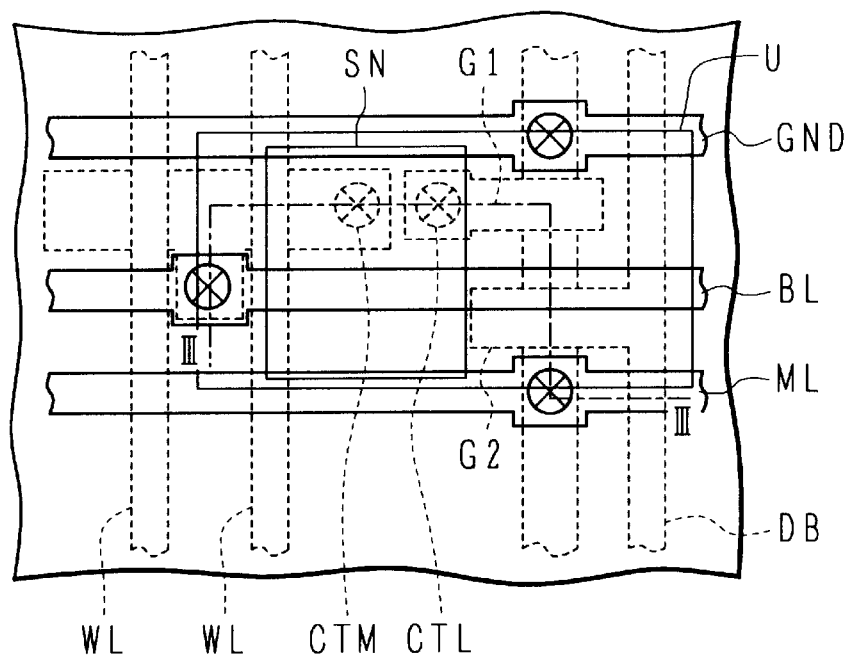
FIG.2C
| $U_{11}$ | $U_{12}$ | $U_{13}$ | $U_{14}$ |
|---|---|---|---|
| $U_{21}$ | $U_{22}$ | $U_{23}$ | $U_{24}$ |
| $U_{31}$ | $U_{32}$ | $U_{33}$ | $U_{34}$ |

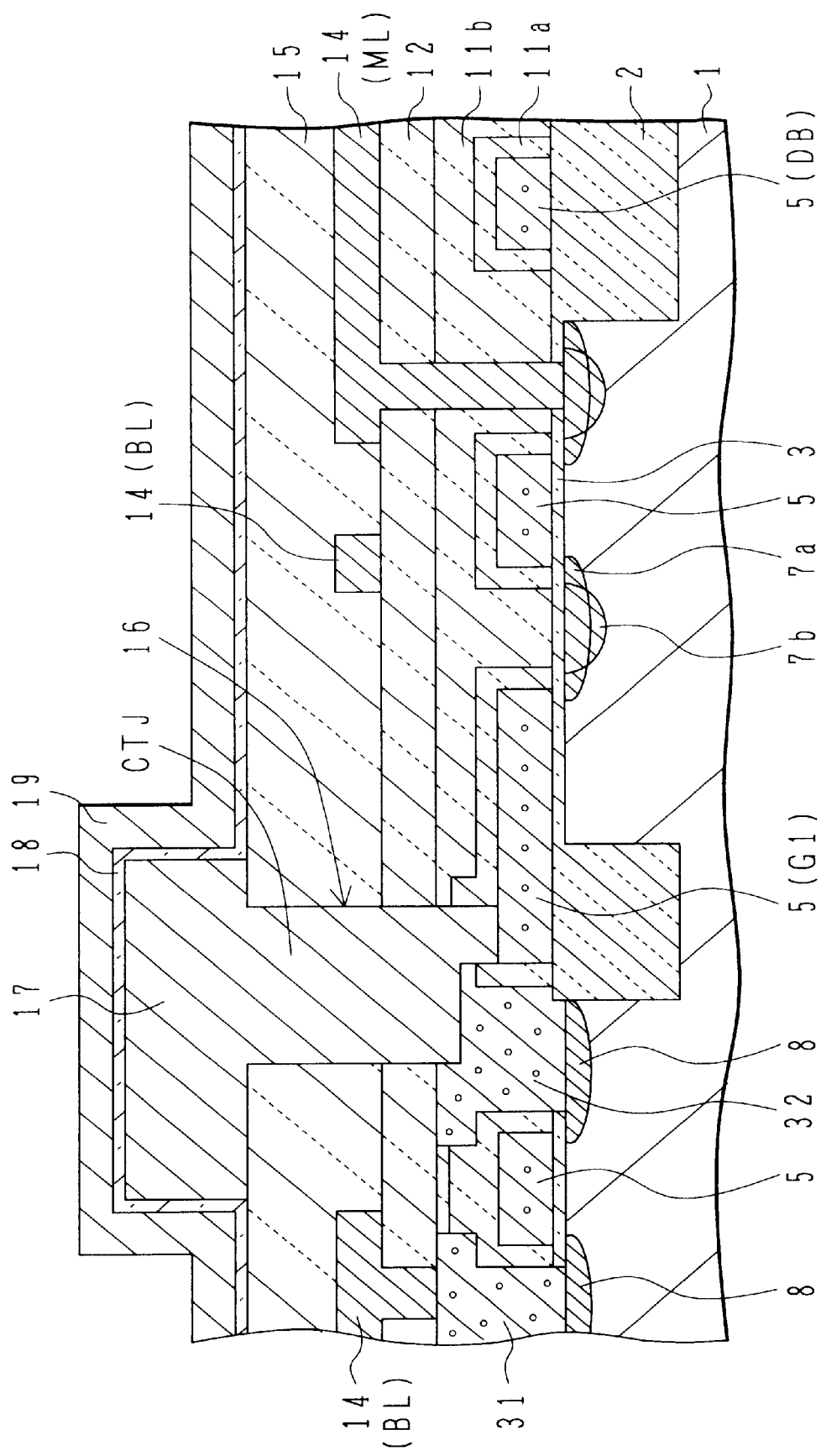

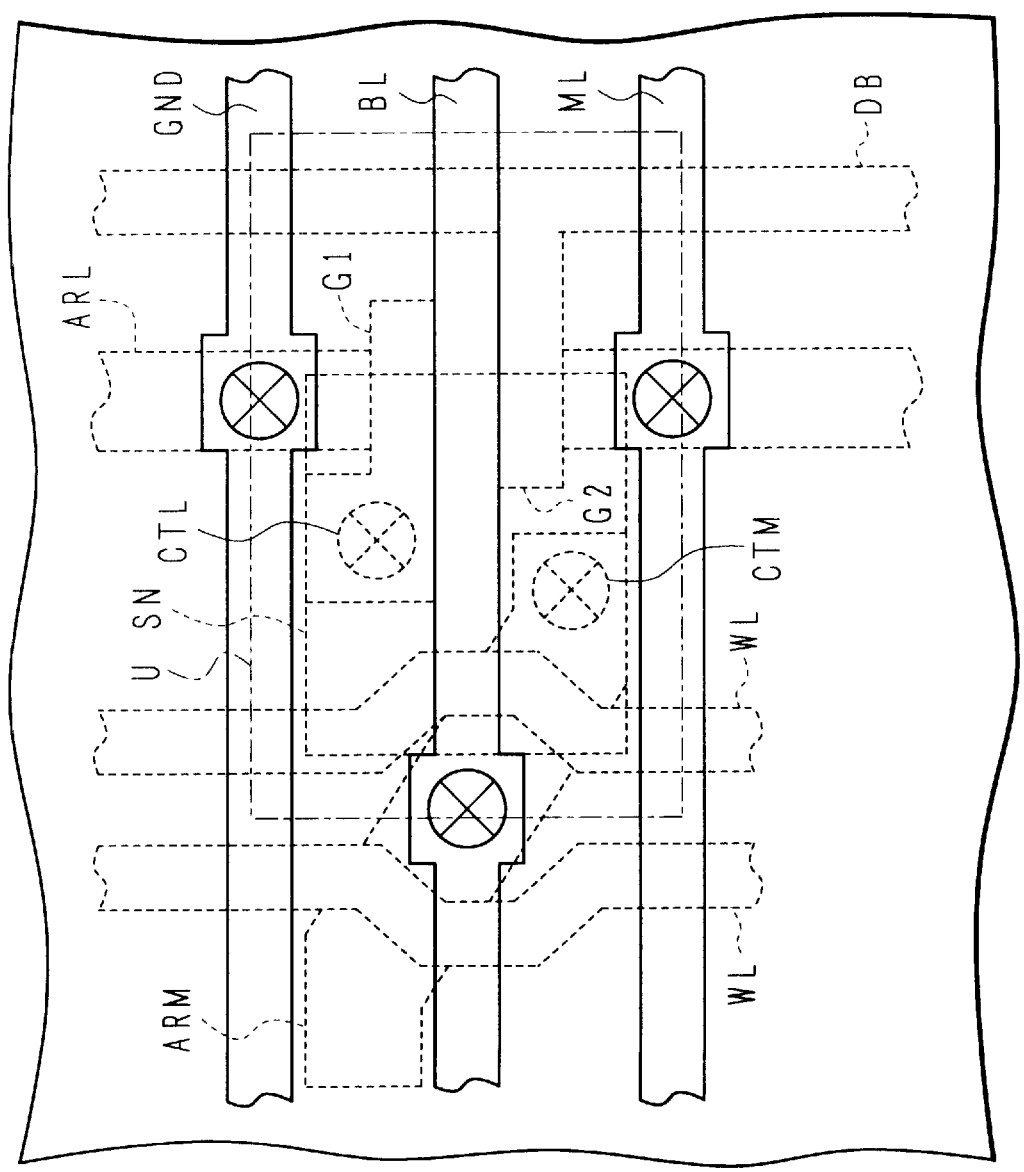
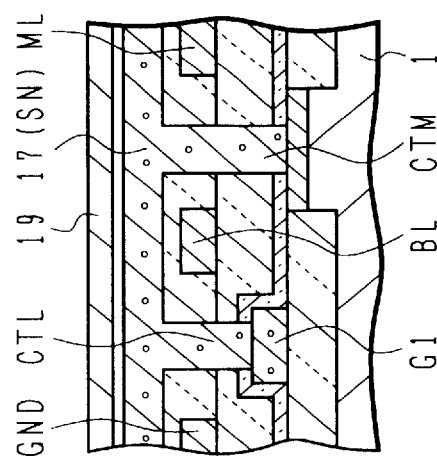

MEMORY-LOGIC SEMICONDUCTOR DEVICE

This application is based on Japanese Patent Application 2000-155585, filed on May 26, 2000, the entire contents of which are incorporated herein by reference.

BACKGROUND OF THE INVENTION a) Field of the Invention

The present invention relates to a semiconductor device, and more particularly to a semiconductor device having a plurality of basic units each containing a memory cell and a logic cell on the same semiconductor substrate.

b) Description of the Related Art

A content addressable memory (CAM) has become noteworthy in order to realize high sophistication and high speed of an information processing system. CAM has the function that a logic cell can detect a match between the contents stored in a memory cell and externally supplied data. The memory cell is generally made of an SRAM.

One of the present inventors has proposed a CAM having the structure that the memory cell is made of a dynamic random access memory (DRAM). With this structure, a memory cell of the basic unit can be made of two access transistors, two capacitors, and four search/compare transistors (for a ternary CAM). However, the most efficient structure of CAM and its manufacture techniques are not still established.

SUMMARY OF THE INVENTION

An object of the invention is to provide a semiconductor device having a plurality of basic units each containing a memory cell and a logic cell on the same semiconductor substrate, the device being easy to be manufactured with high integration.

Another object of the invention is to provide a semiconductor device capable of realizing a high performance CAM.

According to one aspect of the present invention, there is provided a semiconductor device comprising a semiconductor substrate and a plurality of basic units formed on the semiconductor substrate each having a memory element and a logic element and a same plan layout or a bilateral symmetry layout, the basic unit comprising: an isolation insulating region formed on a surface of the semiconductor substrate for defining first and second active regions; a transfer transistor having a first gate electrode formed traversing the first active region and a pair of first source/drain regions formed on both sides of the first gate electrode in the first active region; a word line connected to the first gate electrode; a bit line connected to one of the pair of first source/drain regions; a serially connected transistor having second and third gate electrodes formed traversing the second active region, a connection node formed between the second and third gate electrodes in the second active region, and a pair of second source/drain regions formed outside the second and third gate electrodes; a first signal line connected to one of the pair of second source/drain regions; a second signal line connected to the other of the pair of second source/drain regions; a third signal line connected to the second gate electrode; a storage electrode formed in an area above the other of the pair of first source/drain regions and at least a portion of the third gate electrode; a capacitor dielectric film formed on a surface of the storage electrode; a first conductive connection member formed on and under the storage electrode for connecting the storage electrode to the other of the pair of first source/drain regions; and a second conductive connection member formed on and under the storage electrode for connecting the storage electrode to the third gate electrode.

BRIEF DESCRIPTION OF THE DRAWINGS

FIGS. 1A, 1B and 1C are equivalent circuits of CAM and its logic table.

FIGS. 2A, 2B, and 2C are plan views showing a repetitive unit of CAM according to an embodiment of the invention.

FIG. 8 is a cross sectional view showing the structure of a semiconductor device according to still another embodiment.

FIGS. 11A and 11B are plan views and a cross-section showing another example of the structure of CAM.

DETAILED DESCRIPTION OF THE PREFERRED EMBODIMENTS

Figure 3:
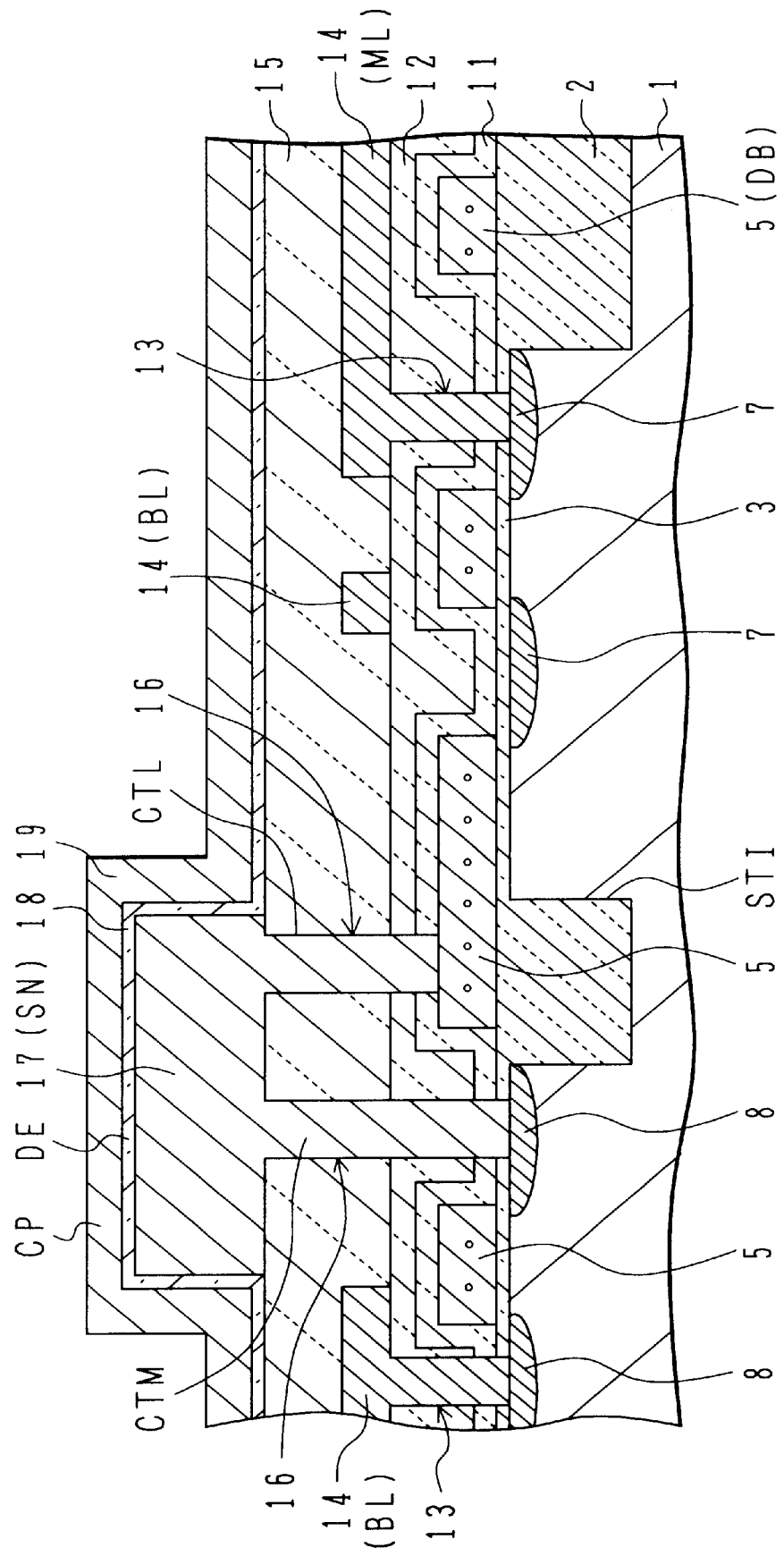
FIG. 3 is a cross sectional views showing the structure of CAM shown in FIG. 2.

FIGS. 1A and 1B show the equivalent circuit and a logical table of a CAM proposed by one of the inventors. In FIG. 1A, U and /U represent the structure of repetitive units. U and /U having the symmetrical structure constitute one CAM unit (basic unit). A plurality of CAM units are disposed in a matrix shape.

Bit lines BL and /BL of a memory cell MC are supplied with complementary data. Transfer transistors Ta and Tb are controlled to be turned on and off by a signal on the same word line WL. Complementary data is written via the transfer transistors Ta and Tb into capacitors Ca and Cb.

Serially connected n-channel transistors Pa and Qa and serially connected n-channel transistors Pb and Qb constitute a search/compare logic cell LC. One ends of the serial connections (ones of source/drain electrodes of transistors Qa and Qb) are connected to a ground line (GND). The other ends of source/drain electrodes of transistors Pa and Pb serially connected to transistors Qa and Qb are connected to the same match line ML.

The potentials at the storage electrodes of the capacitors Ca and Cb are applied to the gate electrodes of the transistors Qa and Qb of the logic circuit.

The on/off states of the transistors Qa and Qb of the logic circuit are therefore controlled by the potentials at the storage electrodes of the capacitors Ca and Cb. The gate electrodes of the transistors Pa and Pb are connected to data bus lines DB and /DB, which carry search data to be compared against data stored in the CAM cells.

The layout of the transistors P (Pa, Pb) and Q (Qa, Qb) may be reversed as shown in FIG. 1C.

In a search and compare operation, the match line ML is precharged to a logic high and a signal and its complementary signal are input to the data bus lines DB and /DB. Subsequently one of the transistors Pa and Pb turns on and the other turns off. If the transistor Qa or Qb serially connected to the turned-on transistor Pa or Pb is on, the potential of the pre-charged match line ML is discharged to the ground line so that the potential of the match line ML changes, indicating that a match between the search and stored data has occurred, otherwise referred to as a fit.

If the transistor Qa or Qb serially connected to the turned-on transistor Pa or Pb is off, the match line ML will not be discharged so that the potential of the match line ML is maintained in the pre-charged state, indicating a mismatch or a miss. The potential change of the match line ML is therefore controlled by the serial connection connected to the high state memory (Ca or Cb).

The bit lines BL and /BL connected to the memory cell MC are connected to a bit line driver circuit BLD, and the word line WL is connected to a word line driver circuit WLD. The data bus lines DB and /DB are connected to a data bus driver circuit DBD, and the match line ML is connected to a match line driver circuit MLD. The data bus line driver circuit DBD may be a terminal itself to which an external signal is input, or a buffer circuit for temporarily storing an external signal.

FIG. 1B illustrates the logic function of the CAM cell unit shown in FIG. 1A. A DRAM row field indicates the charge status of the memory cell MC, or more specifically, of the capacitor Ca or Cb of DRAM. When the capacitor Ca is charged to a high potential, it takes a high (H) level, whereas when it is charged to a low potential, it takes a low (L) level.

The capacitor Cb stores a complementary signal to a signal in the capacitor Ca. When DRAM or more specifically the capacitor Ca takes the high (H) level, the transistor Qa is on and the transistor Qb is off. Therefore, only when the transistor Pa serially connected to the turned-on transistor Qa becomes on (only when the data bus line DB becomes high), the potential of the match line ML is discharged to the ground line. Namely, when the potential of the data bus line DB is high (H), the match line ML is low (L).

If DRAM takes the low level, the capacitor Cb stores a high level potential and the transistor Qb becomes on. Therefore, only when the transistor Pb serially connected to the turned-on transistor Qb becomes on (only when the data bus line /DB becomes high), the potential of the match line ML is discharged and takes the low (L) level. In the case other than the above two cases, the potential of the match line ML is maintained high (H). In the case when the two DRAMs are both in L state, the match line ML is maintained high (H), regardless of the level of the data bus DB. This is called "don't care". This circuit can also achieve this (ternary logic). This logic calculation is summarized in the table shown in FIG. 1B.

In FIG. 1A, the repetitive units U and /U are structured symmetrical. In an actual semiconductor device, it is preferable to use the repetitive units U and /U having the same structure or a right/left bilateral symmetry structure.

FIGS. 2A and 2B show an example of the layout of repetitive units U shown in FIG. 1A. FIG. 2A shows active regions defined by isolation regions formed on the surface of a semiconductor substrate and gate electrodes traversing the active regions. On the semiconductor substrate surface, a field insulating film FOX for element isolation is formed to constitute the isolation regions. The field insulating film FOX may be a silicon oxide film formed through local oxidation of silicon (LOCOS) or shallow trench isolation (STI).

The areas not formed with the field insulating film FOX are active regions ARM and ARL. The active region ARM is a region in which memory elements are formed, and the active region ARL is a region in which logic elements are formed. In FIG. 2A, the active region ARM extends in a horizontal direction and the active region ARL extends in a vertical direction over repetitive units.

After a gate insulating film (such as a silicon oxide film) is formed on the active regions, a polysilicon layer is deposited. By patterning the gate insulating film and polysilicon layer, gate electrodes G1 and G2, a word line WL also serving as gate electrodes, and a data bus line DB are formed.

In FIG. 2A, the word line WL extends in the vertical direction, traversing the active region ARM. In the active region ARL, the separated gate electrode G1 and the gate electrode G2 branched from the data bus line DB along in the vertical direction are formed extending in the horizontal direction. The separated gate electrode G1 extends in the same direction as the memory element active region ARM and forms a contact area of an increased width on the field insulating film FOX.

FIG. 2B shows the layout changed from FIG. 2A by depositing a first insulating film on the substrate with the gate electrodes and the like, forming necessary contact holes through the first insulating film, and forming signal lines of conductive material such as polysilicon on the first insulating film. The signal lines are electrically connected to the underlying active regions at positions indicated by cross marks. A ground line GND and a match line ML extend in the horizontal direction and are connected to the logic element active region ARL at its opposite ends. A bit line BL is formed between the ground line GND and match line ML and connected to one of the source/drain regions in the memory element active region ARM.

The left area from the bit line contact belongs to the left repetitive unit. Namely, two repetitive units adjacent in the horizontal direction are structured in right/left bilateral symmetry, and a single bit line contact is shared by two repetitive units.

After the signal lines GND, BL and ML are covered with a second insulating film, contact holes are formed through the second insulating film to expose the other source/drain region in the memory element active region and the contact area of the separated gate electrode G1. A capacitor storage electrode SN indicated by a broken line is formed on the second insulating film, the electrode SN filling the inside of the contact holes. The storage electrode SN is connected to the other source/drain region of the memory element transistor and the separated gate electrode G1 of the logic element to electrically connect the other source/drain region and the gate electrode G1. A capacitor dielectric film and an opposing electrode are formed to form a capacitor, and hence the repetitive units U shown in FIG. 1A.

FIG. 2C shows an example of the layout of repetitive units on the substrate plane. Repetitive units $U_{11}$ and $U_{12}$ are structured in right/left bilateral symmetry relative to their border line to form one CAM cell. Repetitive units $U_{13}$ and $U_{14}$ are also structured similarly. The repetitive units $U_{12}$ and $U_{13}$ may have a right/left bilateral symmetry structure or the same structure. The repetitive units $U_{11}$ and $U_{12}$ may have the same structure.

The repetitive units $U_{11}$, $U_{12}$, ... and repetitive units $U_{21}$, $U_{22}$, ... are structured in up/down bilateral symmetry relative to their border line. Repetitive units $U_{31}$, $U_{32}$, ... may have an up/down bilateral symmetry structure or the same structure, relative to the repetitive units $U_{21}$, $U_{22}$, .... The repetitive units $U_{11}$, $U_{12}$, ... and repetitive units $U_{21}$, $U_{22}$, ... may have the same structure.

FIG. 3 shows the cross sectional structure taken along one-dot chain line III—III shown in FIG. 2B.

In the surface layer of a silicon substrate 1 formed with necessary wells, for example, element isolating trenches are formed, a silicon oxide film is deposited, and thereafter the surface of the substrate is planarized by chemical mechanical polishing (CMP) or the like to form an element isolating field insulating region (FOX) 2 of STI (shallow trench isolation). A gate oxide film 3 is formed on the surface of an active region defined by the field insulating region 2. On this gate oxide film 3, a polysilicon film is deposited and patterned to form a gate electrode (including signal lines such as word lines) 5.

After the gate electrode 5 is formed, if necessary, by covering an unnecessary area with a resist pattern, n-type impurities are doped into the semiconductor substrate 1 to form logic element source/drain regions 7 and memory element source/drain regions 8. If different ion implantation are performed, optimum impurity concentrations of the logic element and memory element transistors can be set. It is preferable that the impurity concentration of the logic element source/drain region 7 is set higher, for example by one order of magnitude, than that of the memory element source/drain region 8.

A CVD oxide film 11 is formed by chemical vapor deposition (CVD), covering the gate electrode 5. On this CVD oxide film 11, a silicon oxide film 12 providing a planarizing function is formed. Reflow, CMP or the like may be used. After the planarized silicon oxide film 12 is formed, contact holes 13 are formed through the oxide films 12 and 11 by using a resist mask. A conductive film 14 such as polysilicon, tungsten silicide (WSi), or tungsten is deposited on the insulating film 12 and patterned to form ground lines GND (not shown), bit lines BL and match lines ML, the conductive film 14 filling the contact holes.

An insulating film 15 such as borophosphosilicate glass (BPSG) is deposited over the wiring 14, and contact holes 16 for capacitor storage electrode are formed through the insulating films 15, 12 and 11 by using a resist mask. A conductive layer such as polysilicon is deposited on the insulating film 15 formed with the contact holes, and patterned to form a storage electrode 17. The polysilicon is filling in the contact holes 16.

Connection parts CTM and CTL are formed continuously from and on the bottom surface of the storage electrode 17 and are electrically connected. The connection part CTM connects the bottom surface of the storage electrode SN to one of the source/drain regions 8 of the memory element. The connection part CTL connects the bottom surface of the storage electrode SN to the gate electrode 5 (G1) of the logical element. A capacitor dielectric film 18 is formed on the whole substrate surface and a cell plate (opposing) electrode 19 is formed thereon.

In the above manner, the repetitive units U are formed. Other repetitive units can be formed having the same structure or the bilateral symmetry structure.

FIGS. 4A to 4E are cross sectional views illustrating the manufacture processes for the semiconductor device shown in FIG. 3.

Figure 4A:
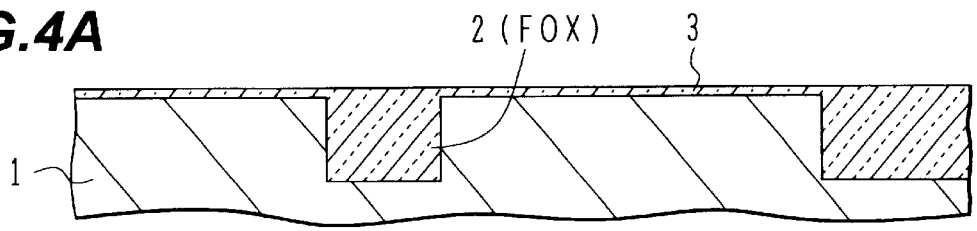
FIGS. 4A to 4E are cross sectional views of a semiconductor substrate illustrating the processes of manufacturing the structure shown in FIG. 3.

As shown in FIG. 4A, on the surface of a silicon substrate 1, a field insulating film (FOX) 2 for element isolation is formed. For example, the field oxide film is formed by forming a silicon nitride film pattern on a buffer oxide film in an area corresponding to the active regions and then performing local oxidation of silicon (LOCOS). Alternatively, shallow trench isolation (STI) may be used. In this case, a resist pattern is formed on the silicon substrate 1, and element separation trenches are formed through etching. Next, a silicon oxide film is deposited filling the trenches, and the surface is planarized by CMP or the like.

After the field insulating film 2 is formed, impurity ions are implanted for transistor threshold value adjustment when necessary. Different ion implantation may be executed by separating the memory element region and logic element region with resist patterns. In this case, it is preferable to execute the ion implantation so that the off-characteristics of memory elements can be improved and the operation speed of logic elements can be raised. After the ion implantation for threshold value adjustment, a gate oxide film 3 is formed through thermal oxidation or the like in the active region with exposed silicon surface defined by the field insulating film 2.

Figure 4B:
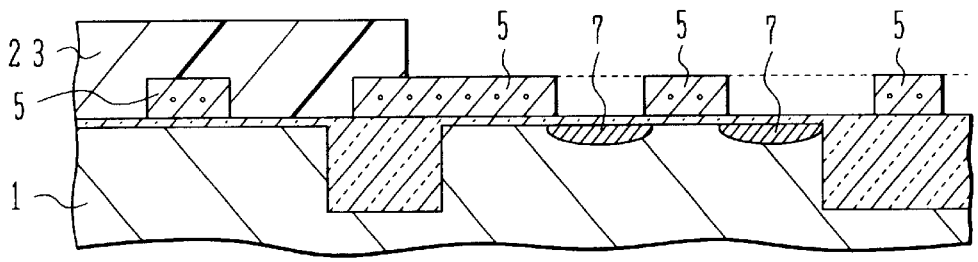

As shown in FIG. 4B, a conductive film such as polysilicon is deposited over the whole surface of the semiconductor substrate. If a CMOS structure is to be incorporated, by using a resist mask having an opening corresponding to the area where n-channel MOS transistors are formed, n-type impurity ions P are implanted, and by using a resist mask having an opening corresponding to the area where p-channel MOS transistors are formed, p-type impurity ions B are implanted. With this ion implantation, the gate electrode of an n-channel MOS transistor becomes an n-type to form a surface channel MOS transistor.

Thereafter, by using a resist mask formed on the conductive film, the conductive film is patterned to form a gate electrode (including signal lines) 5.

Next, by using a resist mask 23 covering the memory element region, n-type impurity ions As are implanted into the logic element region at an acceleration energy of 10 keV and at a dose of $5\times10^{14}$ cm$^{-2}$. With this ion implantation, source/drain regions 7 of the logic element in a CAM region are formed.

Figure 4C:
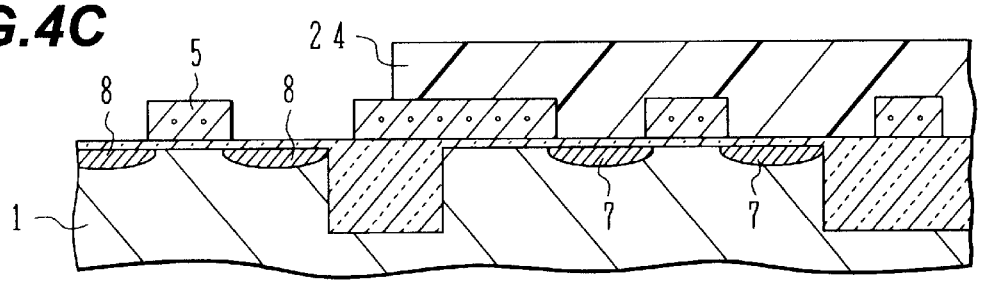

As shown in FIG. 4C, a resist mask 24 covering the logic element region is formed on the surface of the semiconductor substrate. By using this resist mask 24, n-type impurity ions P are implanted into the memory element region at an acceleration energy of 30 keV and at a dose of $3\times10^{13}$ cm$^{-2}$ to form source/drain regions 8 on both sides of he gate electrode 5.

Ion implantations are controlled so that the impurity concentration of the source/drain regions 8 of the MOS transistor in the memory element region is lower than that of the source/drain regions 7 of the MOS transistor in the logic element region. With this impurity concentration control, the retention characteristics of the memory element can be improved and the operation speed of the logic element can be raised. Ion implantations illustrated with FIGS. 4B and 4C may be performed by the same process.

Figure 4D:
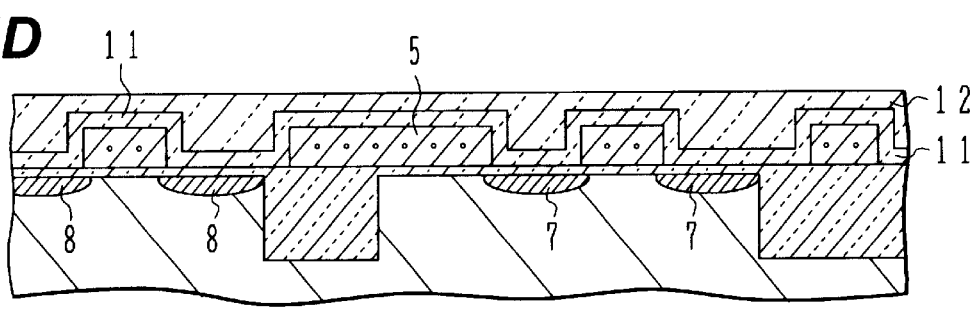

As shown in FIG. 4D, a silicon oxide film 11 is deposited over the whole surface of the silicon substrate by chemical vapor deposition (CVD), the film 11 covering the gate electrode 5. Instead of the oxide film, a nitride film or a lamination film of oxide and nitride may be used. A silicon oxide film 12 providing a planarizing function is deposited on the silicon oxide film 11. For example, a borophosphosilicate glass (BPSG) film or a silicon oxide film using tetraethoxysilane (TEOS) is deposited.

Reflow or CMP may be performed for surface planarization. In place of the interlayer insulating film of a two-layer structure, a three-layer structure may also be used. In this case, in place of the silicon oxide film of the two-layer structure, a lamination layer of silicon oxide, silicon nitride, and silicon oxide may be used.

Figure 4E:
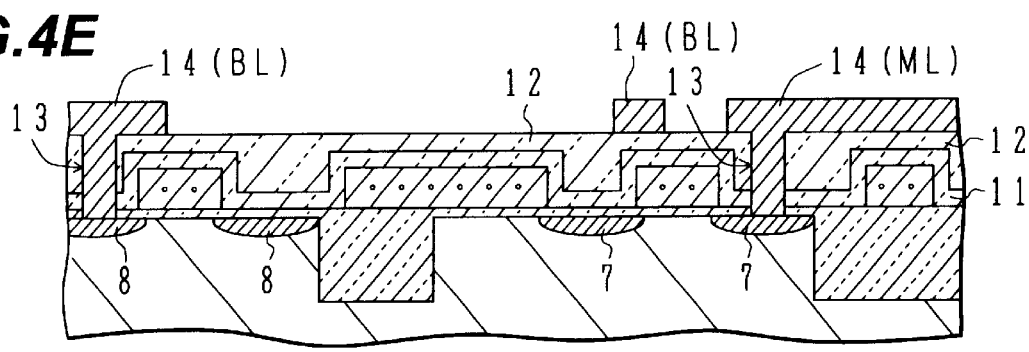

As shown in FIG. 4E, by using a resist mask, contact holes 13 are formed through the silicon oxide films 12 and 11. A conductive film is grown to form a wiring layer filling the contact holes. The conductive film may be a polysilicon film doped with P or a WSi film. A resist mask is formed on the wiring layer to pattern the wiring layer and form a wiring 14. The wiring 14 shown in the left area in FIG. 4E is a bit line BL, and the wiring 14 shown in the right area in FIG. 4E is a match line ML.

The wiring layer may be a single-layer conductive layer such as a polysilicon layer, or a lamination layer of two, three or more layers such as a Ti layer, a TiN layer and a W layer. The material of the wiring layer may be any material if it gives a desired conductivity and the like.

Thereafter, an insulating film 15 (FIG. 3) is formed on the insulating film 12, covering the wiring 14. After contact holes for the capacitor are formed, a conductive film such as polysilicon is deposited on the insulating film 15 and patterned to form a storage electrode and connection terminals. Thereafter, a capacitor dielectric film and a cell plate electrode are formed to complete a CAM cell.

In the structure shown in FIGS. 2A and 2B, the contact holes are formed for one of the source/drain regions of the memory element and for one of the gate electrodes of the logic element. This structure of two contact holes may be replaced by the structure of one contact hole.

Figure 5:
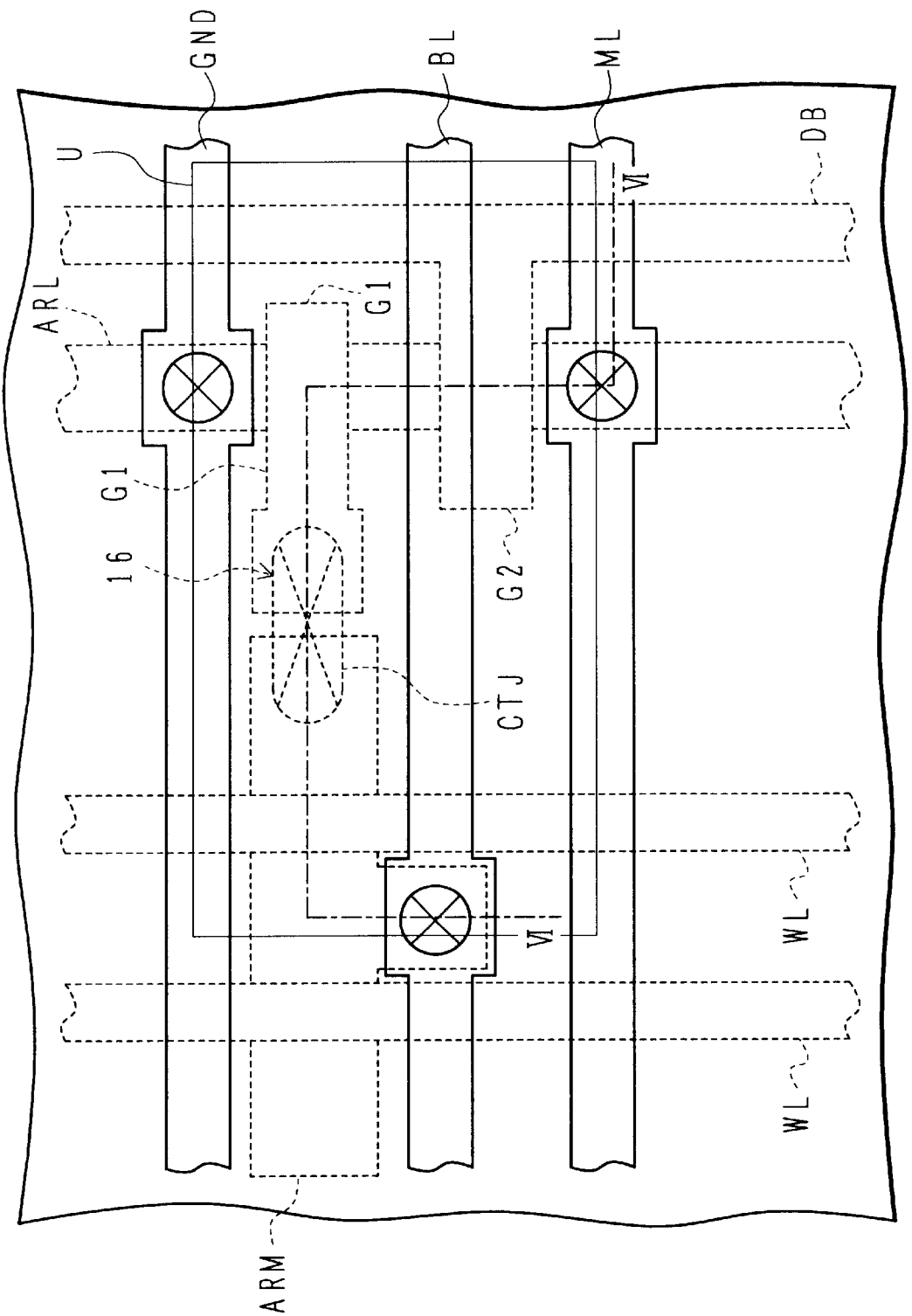
FIG. 5 is a plan view showing the structure of CAM according to another embodiment of the invention.

FIG. 5 shows the structure that one contact hole connects one of the source/drain regions of the memory element and one of the gate electrodes of the logic element. A contact hole 16 is formed through the insulating film in such a manner that the contact hole covers the end portion of the active region ARM of the memory element and the contact portion of the gate electrode G1 of the logic element. A connection terminal CTJ fills the contact hole 16. The connection terminal CTJ electrically connects one of the source/drain regions of the memory element, a storage electrode, and one of the gate electrodes G1 of the logic element. The other structures are similar to those shown in FIGS. 2A and 2B.

Figure 6:
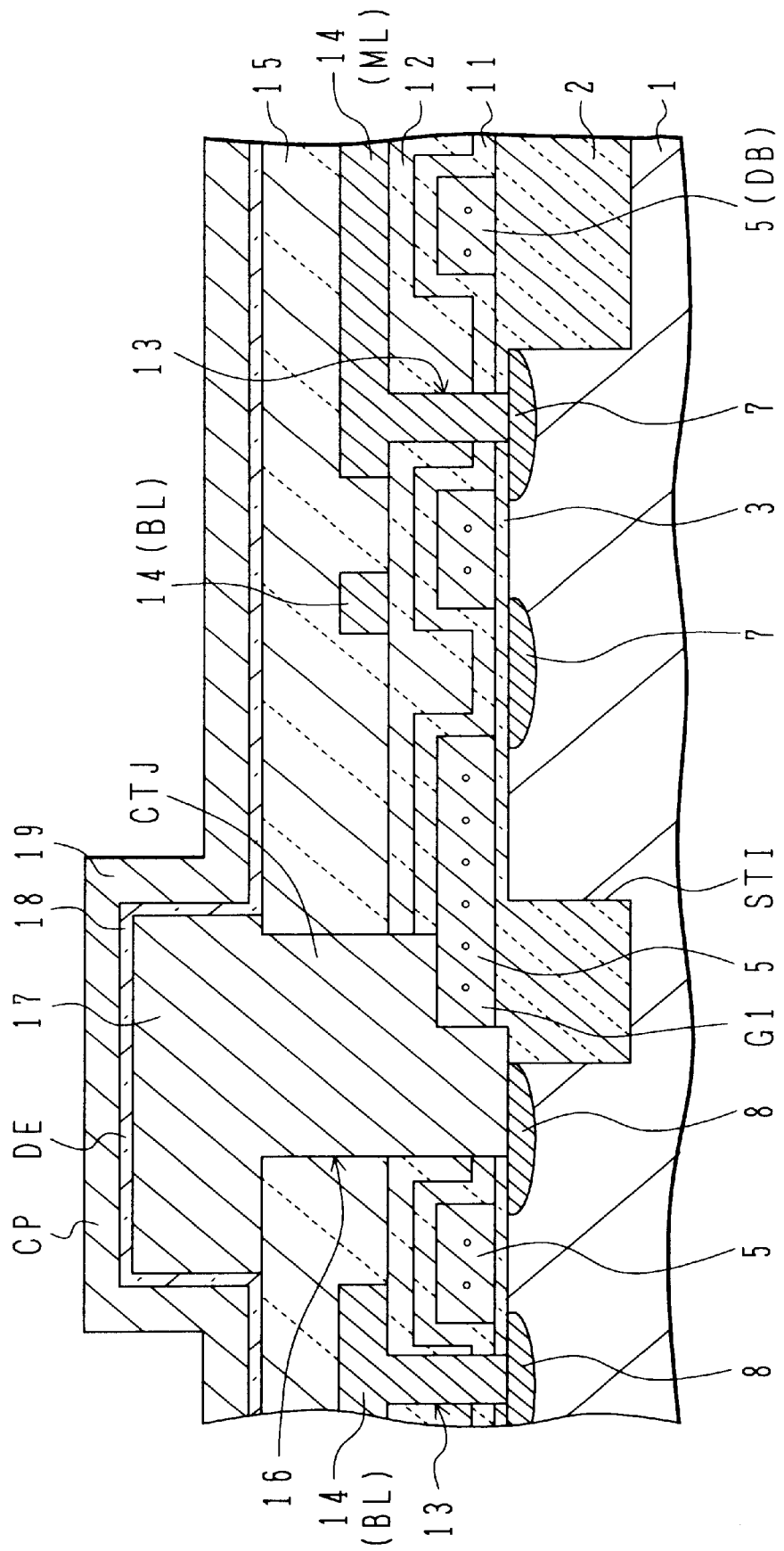
FIG. 6 is a cross sectional view showing the structure of CAM shown in FIG. 5.

FIG. 6 shows the cross sectional structure taken along line VI—VI shown in FIG. 5. The contact hole 16 functions as the two contact holes 16 shown in FIG. 3, and has a broader cross sectional area. One of the source/drain regions 8 of the memory element and the gate electrode G1 of the logic element are exposed at the bottom of the contact hole 16. The connection terminal CTJ is formed filling the contact hole 16 and electrically connects one of the source/drain regions 8 and the gate electrode G1. The other structures are similar to those shown in FIG. 3.

Figure 7:
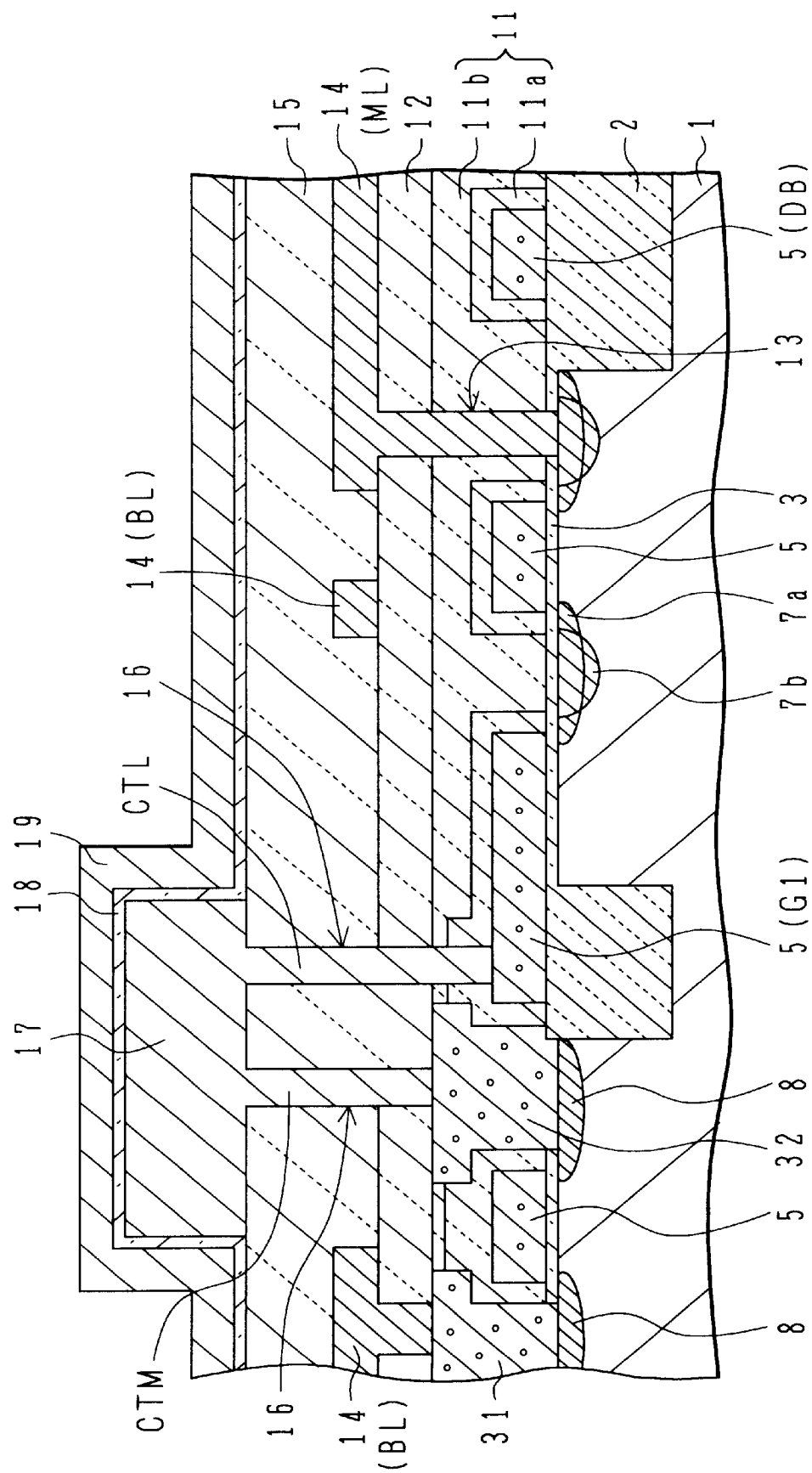
FIG. 7 is a cross sectional view showing the structure of a semiconductor device according to another embodiment.

FIG. 7 shows the structure of the connection terminal partially using a plug. The MOS transistor of the logic element of this embodiment has the LDD structure.

As shown, similar to the embodiments described above, a field insulating film 2 and a gate insulating film 3 are formed on a semiconductor substrate 1. A gate electrode 5 is formed on the gate insulating film 3, the upper and side surfaces of the gate electrode 5 are covered with a silicon nitride film 11a. A silicon oxide film 11b is formed over the substrate, covering the silicon nitride film. The silicon nitride film 11a and silicon oxide film 11b are collectively called a first insulating film 11.

Contact holes are formed through the first insulating film 11 in areas above the source/drain regions of the memory element, exposing the silicon nitride film on the side walls of the gate electrode. Conductive plugs 31 and 32 of, for example, polysilicon or tungsten, are being filled in these contact holes.

In the logic element region, the source/drain regions 7 of the logic element transistor have the LDD structure with low impurity concentration regions 7a and high impurity concentration regions 7b. In order to form the LDD structure, the silicon nitride film 11a forms the side spacers on the side walls of the gate electrode 5 and portions thereof on the source/drain regions are removed.

More specifically, a silicon nitride film having the same shape as the gate electrode is formed in advance on the upper surface of the gate electrode. Therefore, even if the silicon nitride film on the flat surface is anisotropically etched to form the side spacers and the source/drain regions are exposed, the silicon nitride film is left on the upper surface of the gate electrode. Namely, the upper and side surfaces of the gate electrode are covered with the silicon nitride film. This anisotropic etching etches the insulating film 11a in the logic element region, and the thickness thereof is less than that of the insulating film 11a in the memory element region.

A second insulting film 12 is deposited on the first insulating film 11. A plug 31 is formed on one of the source/drain regions 8 of the memory element and a contact hole 13 is formed reaching one of the source/drain regions 7 of the logic element. A conductive film 14 is formed on the surface of the second insulating film 12, filling the contact holes, to form a bit line BL and a match line ML.

A third insulating film 15 is formed over the substrate, covering the wiring 14. Contact holes 16 are formed from the surface of the third insulating film 15 to the plug 32 of one of the source/drain regions 8 of the memory element and to the separated gate electrode G1 of the logic element. A conductive region 17 is formed, filling the contact holes 16 to form a storage electrode SN, and connection terminals CTM and CTL. A capacitor dielectric film 18 and a cell plate electrode 19 are formed, covering the storage electrode to form a CAM cell.

The conductive layer 17 in the memory element region, forming the storage node SN of the capacitor is sufficient if it reaches the upper surface of the plug 32 so that the connection terminal can be formed more reliably. The upper surface of the plug 32 may be formed with a trench by the contact hole etching process.

Similar to the structure shown in FIG. 5, one connection terminal may be used for connecting one of the source/drain regions of the memory element 8 and the gate electrode G1 of the logic element by using plugs.

FIG. 8 shows the structure of such connection. Plugs 31 and 32 have the same structure as that of the embodiment shown in FIG. 7. The upper surface of the plug 32 has a step formed by an etching process. A contact hole covering both the plug 32 and gate electrode G1 is formed and a connection terminal CTJ is formed, filling the contact hole. This common connection terminal CTJ electrically connects a storage electrode 17, plug 32 and gate electrode G1. The other structures are similar to those shown in FIG. 7.

FIGS. 9A to 9E illustrate the processes of manufacturing a CAM structure shown in FIGS. 7 and 8. The manufacture processes for the CAM structure shown in FIG. 8 will be described.

Figure 9A:
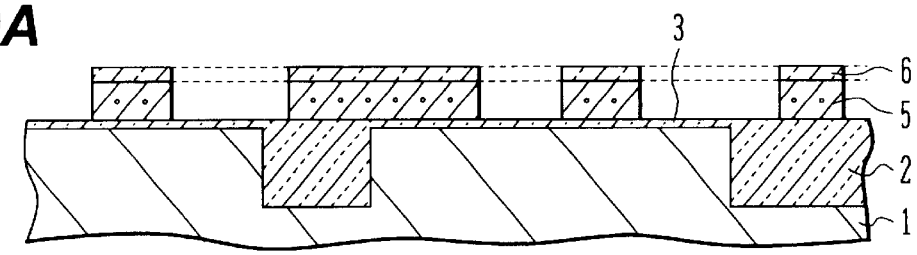
FIGS. 9A to 9E are cross sectional views of a semiconductor substrate illustrating the processes of manufacturing the structure shown in FIG. 8.

As shown in FIG. 9A, similar to the embodiment described above, in and on the surface of a silicon substrate 1, a field insulating film 2 and a gate oxide film 3 are formed. After the gate oxide film 3 is formed, a lamination layer of a polysilicon film 5 and a silicon nitride film 6 laminated in this order from the bottom is formed over the silicon substrate surface. A resist mask is formed on the surface of the silicon nitride film 6 to pattern the polysilicon film 5 and a silicon nitride film 6 in the same shape. Thereafter, the resist mask is removed.

Figure 9B:
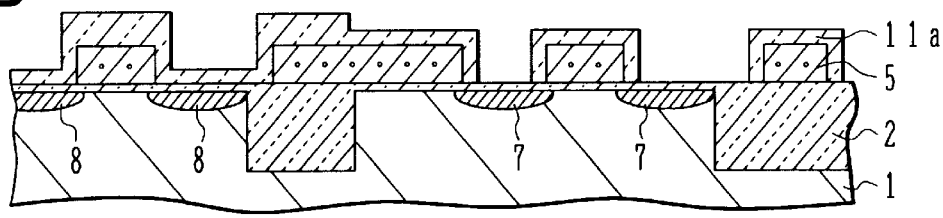

As shown in FIG. 9B, different ion implantations are executed for the memory element region and logic element region by using resist masks. The source/drain regions 7 in the logic element region and the source/drain regions 8 in the memory element region are therefore formed. Thereafter, a silicon nitride film 11a is deposited over the surface of the silicon substrate, and an anisotropic etching is performed by covering the memory element region with a resist mask.

In the logic element region, the silicon nitride film 11a on the source/drain regions 7 is removed to leave side spacers on the side walls of the gate electrode 5. The silicon nitride film 11a is integrated with the underlying silicon nitride film 6, and the upper and side surfaces of the gate electrode are covered with the silicon nitride film. For convenience of drawing, these silicon nitride films 6 and 11a are collectively represented by 11a. A step is formed on the silicon nitride film 11a at the border between the logic element region and memory element region, the height of the step corresponding to the etch amount by the anisotropic etching.

Figure 9C:
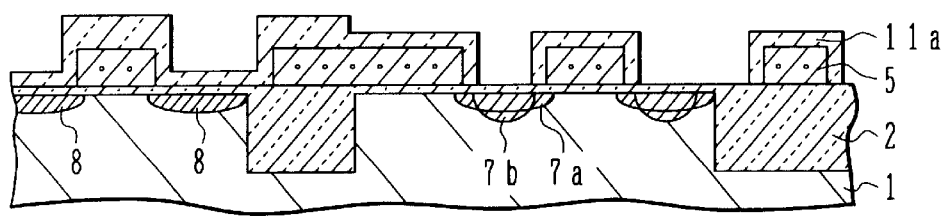

As shown in FIG. 9C, in the logic element region with the side spacers, n-type impurity ions such as As ions are further implanted. If a CMOS structure is to be incorporated, different ion implantations are executed for the n-channel MOS region and p-channel MOS region by using resist masks. The source/drain regions having the LDD structure are therefore formed in the logic element region, having a higher impurity concentration than that of the source/drain regions in the memory element region. The source/drain regions 8 of the memory element region are maintained at a low impurity concentration so that the retention characteristic of the memory can be maintained high.

Figure 9D:
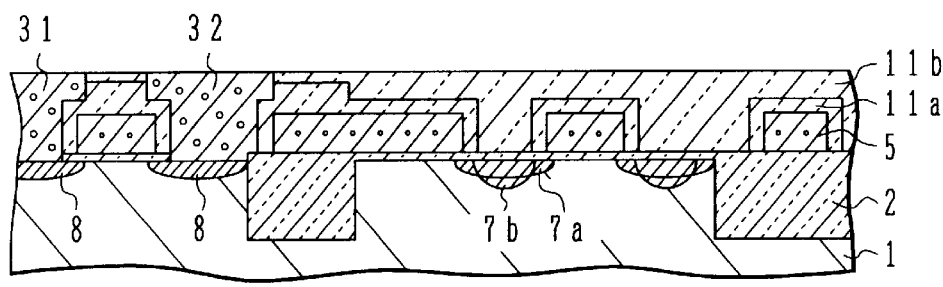

As shown in FIG. 9D, another insulating film 11b is formed over the silicon substrate surface. For example, a lamination layer of a silicon nitride film and a BPSG film is formed and a reflow process is performed to planarize the surface of the insulating film. Instead of the silicon nitride film, a CVD silicon oxide film, a lamination layer such as a lamination layer of a silicon oxide film and a silicon nitride film may also be used. Instead of the reflow process or after the reflow, CMP may be executed for surface planarization.

A resist mask is formed on the insulating film 11b, and contact holes exposing the source/drain regions 8 of the memory element region are formed. In this contact hole forming process, the silicon nitride film covering the gate electrode realizes a self-alignment contact hole forming process. Thereafter, the resist mask is removed, and a polysilicon film doped with n-type impurities such as P is deposited. This conductive film on the insulating film 11b is removed by CMP to form plugs 31 and 32.

Figure 9E:
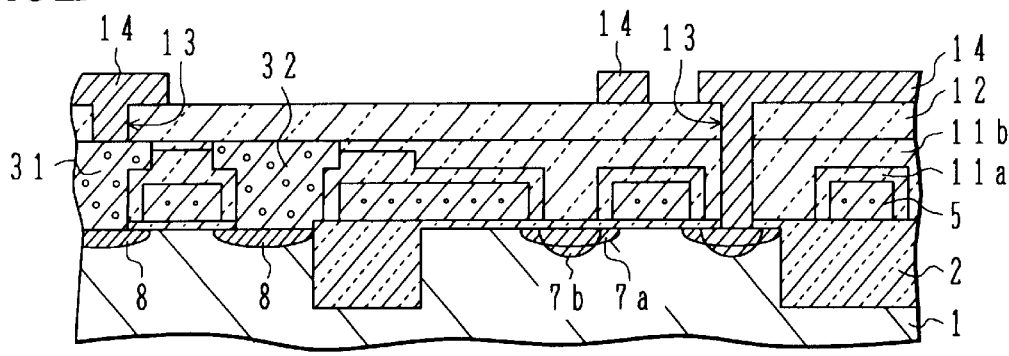

As shown in FIG. 9E, an insulating film 12 such as a silicon oxide film is formed on the insulating film 11b, and contact holes 13 are formed by using a resist mask. A polysilicon film, a lamination film of a polysilicon film and a WSi film or the like is formed on the insulating film 12 with the contact holes and patterned by using a resist mask to form wiring layers 14.

An interlayer insulating film 15 (FIGS. 7 and 8) such as a silicon oxide film and a BPSG film is deposited and reflowed to planarize the surface thereof. CMP may be executed thereafter. Contact holes are formed by using a resist mask. Depending upon the shape of the resist mask, the structure shown in FIG. 7 or FIG. 8 can be formed selectively.

A polysilicon layer is deposited filling the contact holes. The polysilicon film is patterned to form a storage electrode SN and connection terminals (CTM, CTL, CTJ). Subsequently, a capacitor dielectric film 18 and a polysilicon film 19 are deposited and patterned to form the storage capacitor structure. If necessary, an insulating film such as BPSG is formed, reflowed and planarized by CMP, contact holes are formed, and a wiring layer is formed to complete CAM.

The structure of the repetitive unit of CAM is not limited to those shown in FIG. 2B and FIG. 5.

Figure 10:
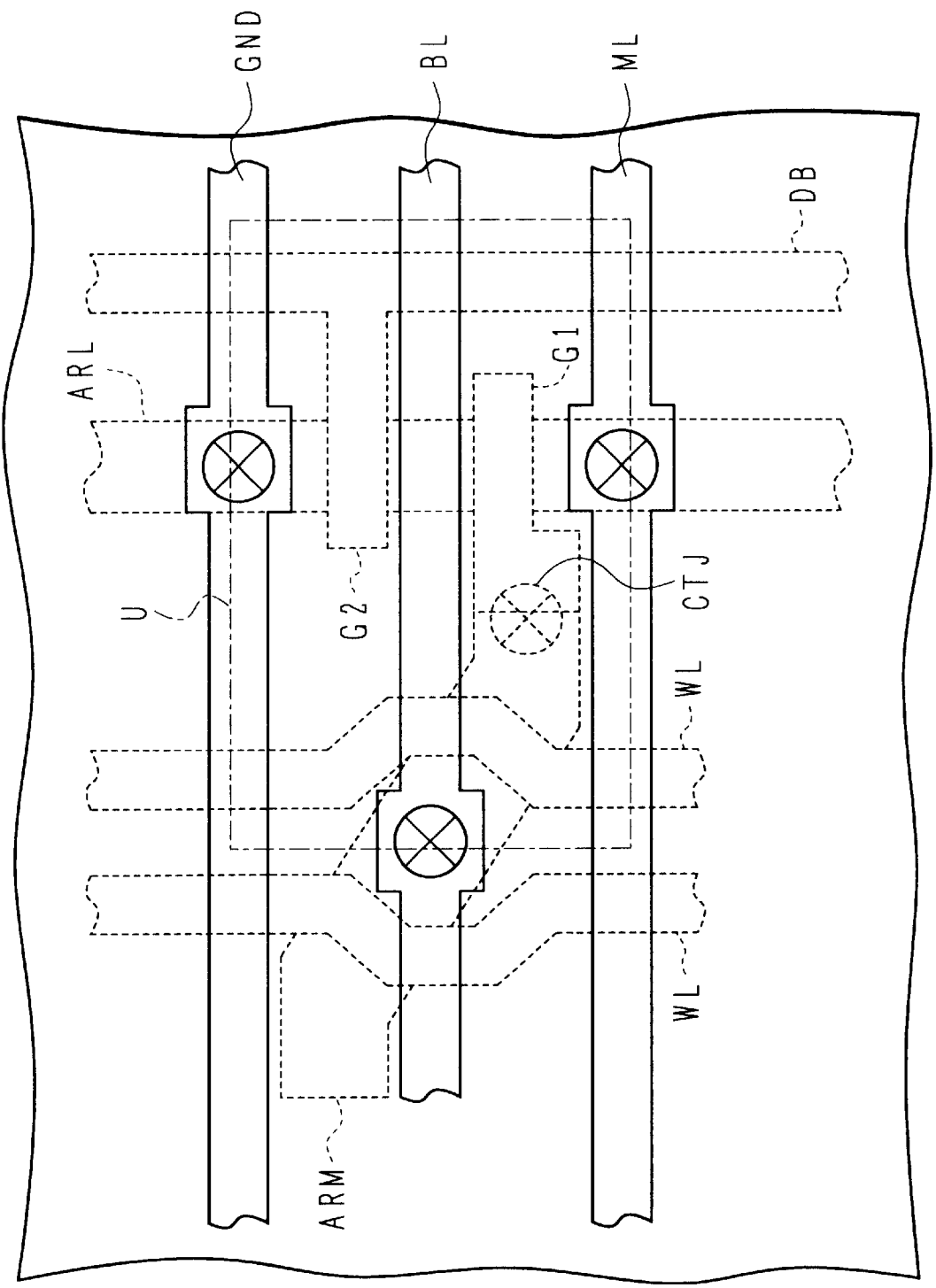
FIG. 10 is a plan view showing another example of the structure of CAM.

FIG. 10 shows a modification of the layout of CAM. As compared with the structure shown in FIG. 2B, the position of the separated gate electrode G1 of the logic element is exchanged by the position of the gate electrode G2 connected to the data bus line DB. The equivalent circuit is shown in FIG. 1C. The word lines WL are curved to surround the bit line contact. The active region ARM of the memory region includes two end areas extended in parallel to the signal lines GND, BL and ML and an oblique area between the end areas. It is preferable that the active region is generally perpendicular to the word lines WL.

Similar to the embodiment shown in FIG. 5, one of the source/drain regions in the active region ARM and the separated gate electrode G1 of the logic element are connected by the connection terminal CTJ formed in one contact hole. The other structures are similar to those shown in FIG. 2B.

FIGS. 11A and 11B show another modification. FIG. 11A shows a plan layout, and FIG. 11b shows the cross sectional structure. Similar to the modification shown in FIG. 10, the active region ARM of the memory element has a deflected shape, and the word lines WL have a curved shape to surround the bit line contact area. The separated gate electrode G1 in the logic element region is disposed between the ground line GND and bit line BL. The gate electrode G2 connected to the data bus line is disposed between the bit line BL and match line ML.

The contact area of the gate electrode G1 is disposed over the bit line BL, between the bit line BL and ground line GND, in the upper area of the right end portion of the memory element active region ARM as viewed in FIG. 11A. Since the right end portion of the memory element active region ARM and the separated gate electrode G1 are disposed in different areas, the lateral size as viewed in FIG. 11A can be utilized effectively. The layout of the separated gate electrode G1 and the gate electrode G2 connected to the data bus line DB is similar to that shown in FIG. 2B. The equivalent circuit is shown in FIG. 1A.

As shown in FIGS. 11A and 11B, the connection terminal CTM of the memory element and the connection terminal CTL of the logic element are disposed on opposite sides of the bit line BL and aligned in the vertical direction as viewed in FIG. 11A. The other structures are similar to those shown in FIG. 2B and FIG. 10.

Figure 12:
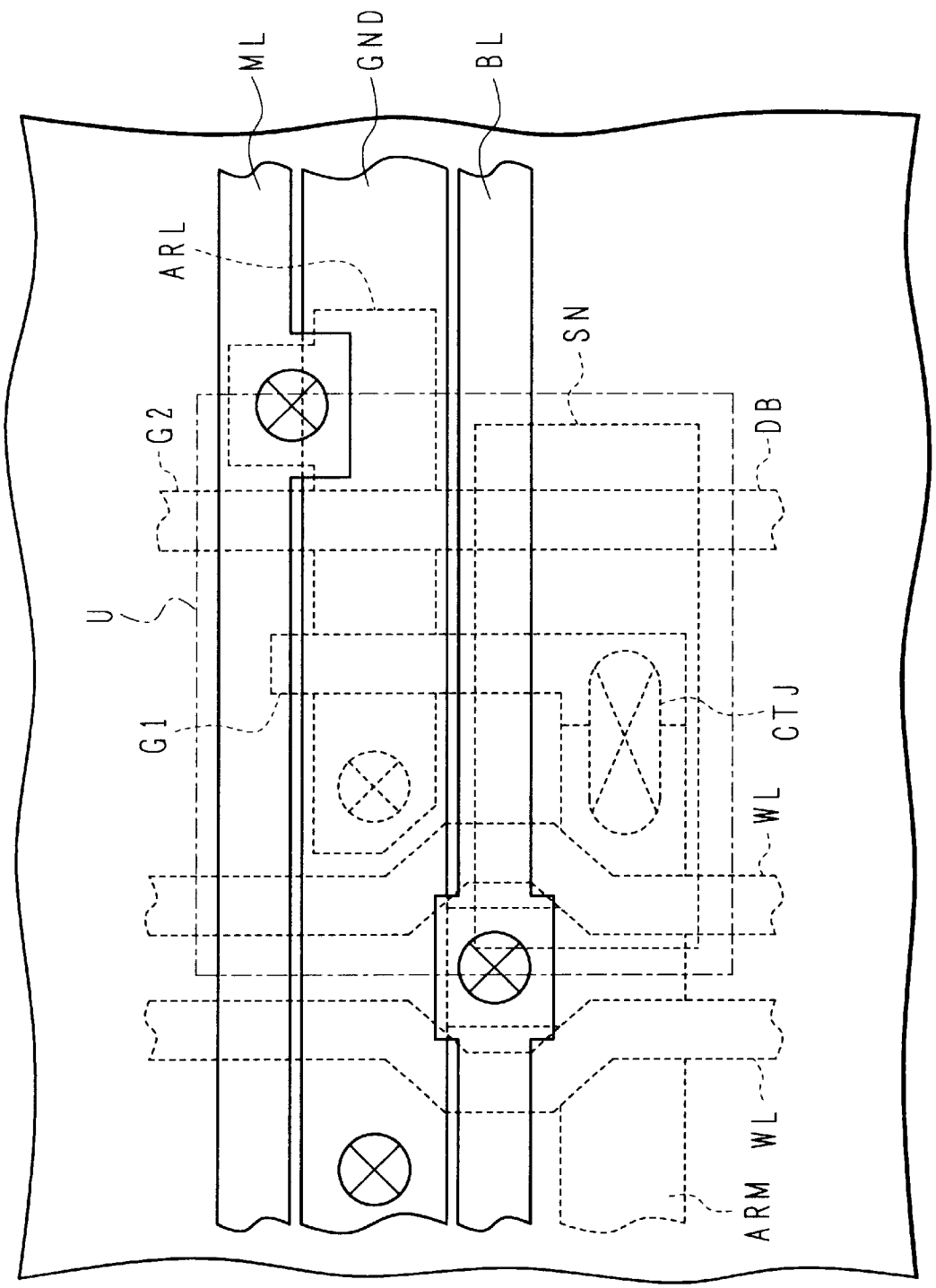
FIG. 12 is a plan view showing another example of the structure of CAM.

FIG. 12 shows another example of the layout. In this example, the active region ARM of the memory element and the active region ARL of the logic element both have the shape extending in the lateral direction, and have the contact area projecting upward.

The word line WL serving also as the gate electrode of the memory element, separated gate electrode G1 of the logic element, and data bus line DB serving also as the gate electrode G2 all have the shape extending in the vertical direction. The word lines WL have a curved shape to surround the bit line contact area.

The bit line BL and match line ML are formed extending in the lateral direction, by using the same wiring layer above the gate electrodes. By using the higher level wiring layer, the storage electrode SN and ground line GND are formed. One of the source/drain regions of the memory element and the separated gate electrode G1 of the logic element are connected by a single connection terminal CTJ. Although the ground line GND extends in the lateral direction, it may extend in the vertical direction. The equivalent circuit is shown in FIG. 1A.

Figure 13:
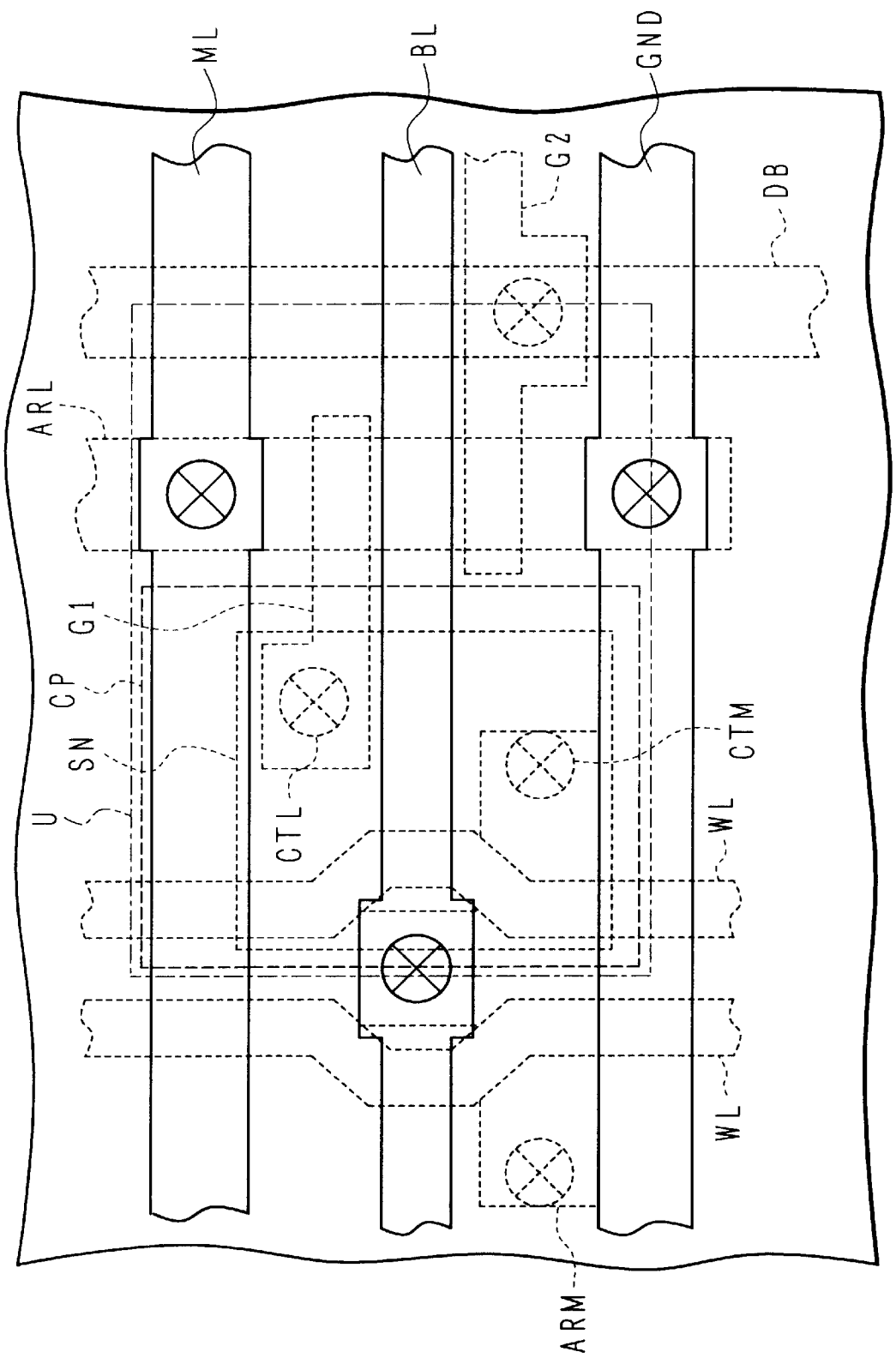
FIG. 13 is a plan view showing another example of the structure of CAM.

FIG. 13 shows another example of the layout. In this example, the active region ARM of the memory element extends in the lateral direction and its contact portion projects upward. The active region ARL of the logic element extends in the vertical direction. The word lines WL in the memory element region have a curved shape to surround the bit line contact in the bit line contact area.

The gate electrode in the logic element region extends in the lateral direction. The data bus line DB is formed by the wiring layer above the gate electrode. The contact areas between one of the source/drain regions of the memory element region and the separated gate electrode G1 of the logic element region are disposed on opposite areas of the bit line and aligned in the vertical direction. The equivalent circuit is shown in FIG. 1C. The match line ML and ground line GND may be formed by using the wiring layer different from the wring layer of the bit line BL.

Figure 14:
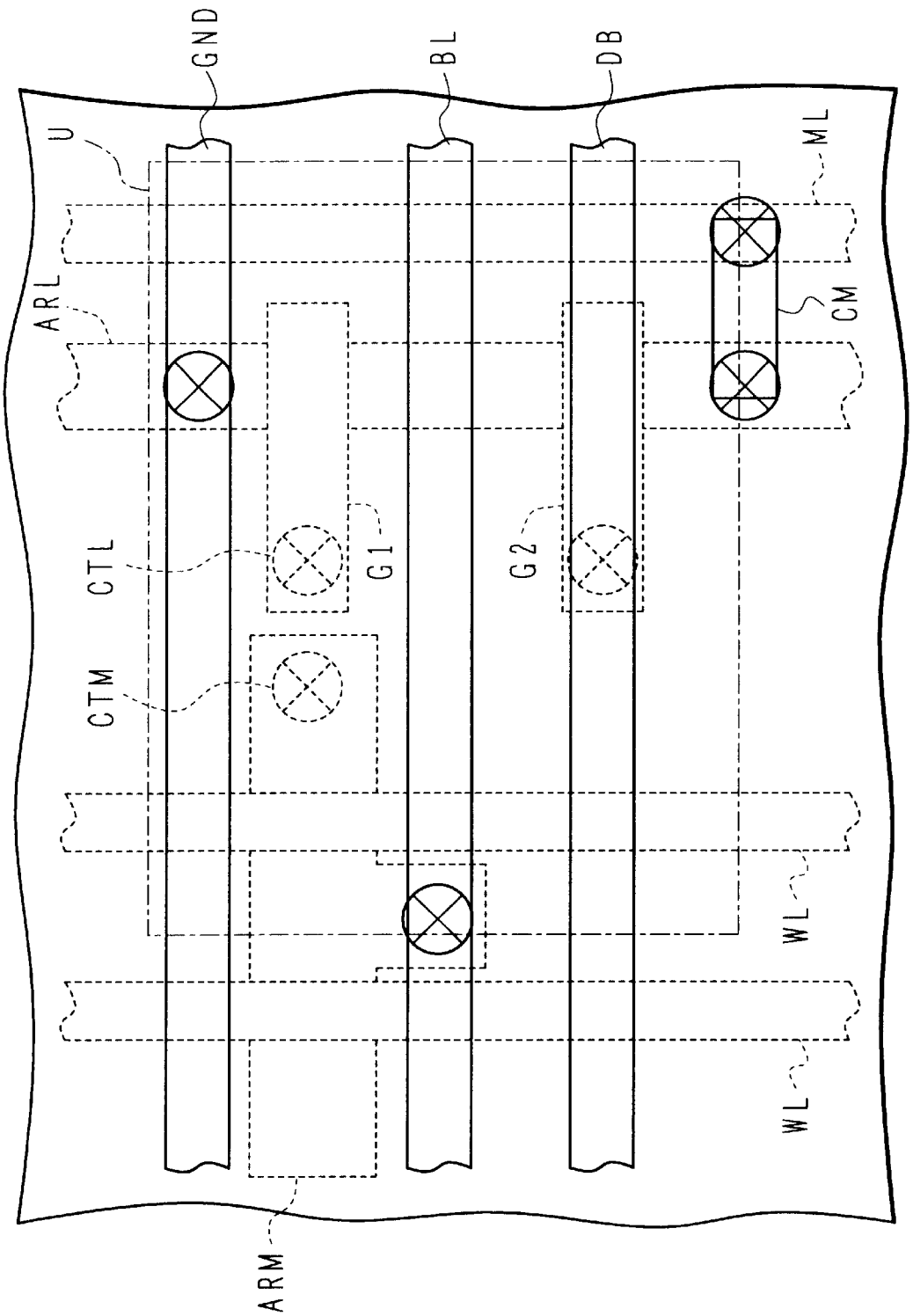
FIG. 14 is a plan view showing another example of the structure of CAM.

FIG. 14 shows another example of the layout. In this example, although the active region ARM of the memory element and the active region ARL of the logic element have the same layout as that shown in FIG. 13, their relative position is different. The memory element active region ARM extends in the lateral direction in the left area as viewed in FIG. 14 and has a downward projection. The word lines WL extend straightforward in the vertical direction.

The separated gate electrode G1 and the gate electrode G2 connected to the upper layer data bus DB line via the contact hole extend in the lateral direction, crossing the logic element active region ARL extending in the vertical direction.

The data bus line DB is formed by the same upper level conductive layer as the ground line GND and bit line BL. These signal lines GND, BL and DB extend in the lateral direction. The match line ML is formed by using the same conductive layer as the gate electrode, and extends in the vertical direction in parallel to the word lines WL. The match line ML is connected to one of the source/drain regions of the logic element region by the connection terminal CM formed by the same conductive layer as the layer of the signal lines GND, BL and DB.

As compared with the layout shown in FIG. 13, the positions of the data bus line DB and match line ML are exchanged. The structures of the connection terminals CTM and CTL via the storage electrode are similar to those shown in FIG. 2B.

Figure 15:
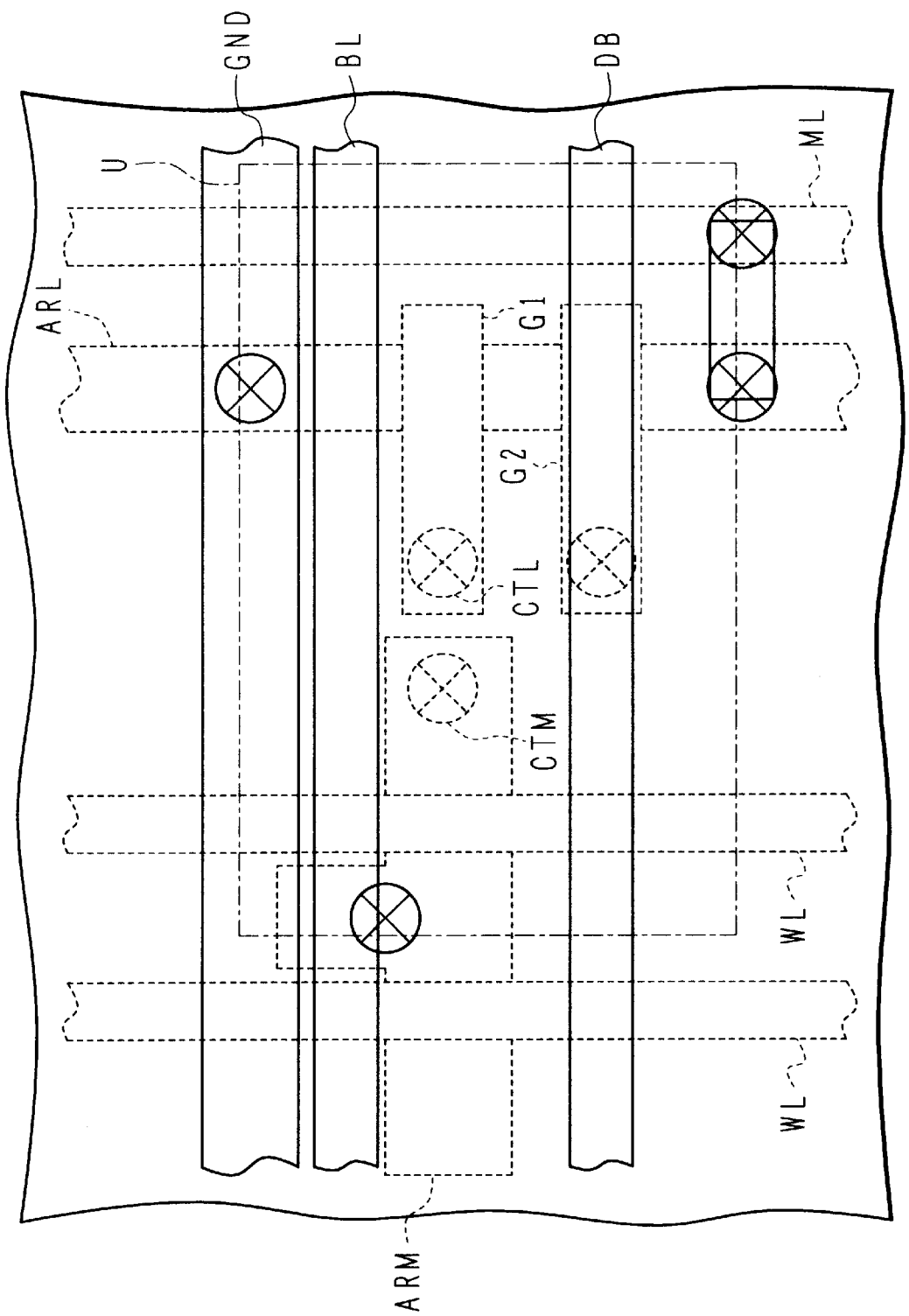
FIG. 15 is a plan view showing another example of the structure of CAM.

FIG. 15 shows another example of the layout. In this example, the bit line contact area of the memory element active region ARM is formed projecting upward, and the bit line BL is disposed just below the ground line GND. As compared with the layout shown in FIG. 14, the bit line BL is moved above the memory element active region ARM. Therefore, the contact hole for the memory element active region ARM is also moved upward.

As described so far, according to the present invention, a semiconductor device is provided having a plurality of basic units each including a memory element and a logic element having an efficient structure.

It is possible to improve the integration degree of CAM and stabilize the manufacture process.

Various other layouts may be used depending upon the peripheral circuit structure and the like. Although the invention has been described in connection with the above embodiments, the invention is not limited thereto. It will be apparent to those skilled in the art, that various modifications, improvements, and combinations can be made.

What are claimed are:

1. A semiconductor device comprising a semiconductor substrate and a plurality of basic units formed on said semiconductor substrate each having a memory element and a logic element and a same plan layout or a bilateral symmetry layout, said basic unit comprising:

an isolation insulating region formed on a surface of said semiconductor substrate for defining first and second active regions;

a transfer transistor having a first gate electrode formed traversing the first active region and a pair of first source/drain regions formed on both sides of the first gate electrode in the first active region;

a word line connected to the first gate electrode;

a bit line connected to one of the pair of first source/drain regions;

serially connected transistors having second and third gate electrodes formed traversing the second active region, a connection node formed between the second and third gate electrodes in the second active region, and a pair of second source/drain regions formed outside the second and third gate electrodes;

a first signal line connected to one of the pair of second source/drain regions;

a second signal line connected to the other of the pair of second source/drain regions;

a third signal line connected to the second gate electrode;

a storage electrode formed in an area above the other of the pair of first source/drain regions and at least a portion of the third gate electrode;

a capacitor dielectric film formed on a surface of said storage electrode;

a first conductive connection member formed on and under said storage electrode for connecting said storage electrode to the other of the pair of first source/drain regions; and a second conductive connection member formed on and under said storage electrode for connecting said storage electrode to the third gate electrode.

2. A semiconductor device according to claim 1, wherein said first and second conductive connection members form an integral conductive connection member.

3. A semiconductor device according to claim 1, wherein said bit line is disposed between said first and second conductive connection members.

4. A semiconductor device according to claim 1, wherein an impurity concentration of the connection node and the pair of first source/drain regions in the second active region is higher than an impurity concentration of the pair of first source/drain regions in the first active region.

5. A semiconductor device according to claim 1, wherein said first conductive connection member includes a conductive plug formed on the other of the pair of first source/drain regions and a first storage electrode extension made of a same material as said storage electrode and formed on said conductive plug.

6. A semiconductor device according to claim 5, wherein said conductive plug has a recess under said first storage electrode extension.

7. A semiconductor device according to claim 1, wherein said second conductive connection member includes a second storage electrode extension made of a same material as said storage electrode.

8. A semiconductor device according to claim 1, further comprising a bit line driver for driving said bit line, a word line driver for driving said word line, a match line driver for pre-charging said second signal line relative to a potential of said first signal line and detecting a voltage after pre-charging, and a data bus driver for driving said third signal line, respectively formed in an outer area of the plurality of basic units.

9. A semiconductor device according to claim 1, wherein said third gate electrode includes an intrinsic gate electrode portion formed on a gate insulating film on the second active region and a contact portion formed on said isolation insulating region and having an increased width, and said second conductive connection member connects said contact portion.

10. A semiconductor device according to claim 9, wherein said third gate electrode extends along a straight line, and the first active region extends along the same straight line near said contact portion.

11. A semiconductor device according to claim 1, wherein a first group of two of said word line, bit line, and first to third signal lines is disposed in parallel and a second group of at least two of remaining three is disposed in parallel and crosses said first group.

12. A semiconductor device according to claim 11, wherein said first group is formed by a first conductive layer and said second group is formed by a second conductive layer at a different level from the first conductive layer.

13. A semiconductor device according to claim 12, wherein said storage electrode is formed by a third conductive layer at a different level from the first and second conductive layers.

* * * * *